US009450068B2

(12) United States Patent
Takeuchi et al.

(10) Patent No.: US 9,450,068 B2
(45) Date of Patent: Sep. 20, 2016

(54) METHOD FOR MANUFACTURING SILICON CARBIDE SEMICONDUCTOR DEVICE

(71) Applicant: DENSO CORPORATION, Kariya, Aichi-pref. (JP)

(72) Inventors: Yuichi Takeuchi, Obu (JP); Naohiro Sugiyama, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/394,115

(22) PCT Filed: Apr. 10, 2013

(86) PCT No.: PCT/JP2013/002434
§ 371 (c)(1),
(2) Date: Oct. 13, 2014

(87) PCT Pub. No.: WO2013/157225
PCT Pub. Date: Oct. 24, 2013

(65) Prior Publication Data
US 2015/0072486 A1 Mar. 12, 2015

(30) Foreign Application Priority Data

Apr. 17, 2012 (JP) .................... 2012-94110

(51) Int. Cl.
*H01L 29/66* (2006.01)
*H01L 29/808* (2006.01)
(Continued)

(52) U.S. Cl.
CPC ..... *H01L 29/66068* (2013.01); *H01L 21/0455* (2013.01); *H01L 21/0475* (2013.01);
(Continued)

(58) Field of Classification Search
CPC .......... H01L 21/0455; H01L 21/0475; H01L 21/324; H01L 21/3247; H01L 21/8213; H01L 29/1029; H01L 29/1066; H01L 29/1608; H01L 29/66068; H01L 29/8083
See application file for complete search history.

(56) References Cited

U.S. PATENT DOCUMENTS

2003/0178672 A1    9/2003 Hatakeyama et al.
2005/0029557 A1    2/2005 Hatakeyama et al.
(Continued)

FOREIGN PATENT DOCUMENTS

JP    2004-311695 A    11/2004
JP    2013-045886 A    3/2013

OTHER PUBLICATIONS

Kang et al., "Post Annealing Etch Process for Improved Reverse Characteristics of 4H-SiC Diode", Material Science Forum vols. 615-617 (2009), pp. 663-666, Trams Tech Publications, Switzerland.*

(Continued)

*Primary Examiner* — Marvin Payen
*Assistant Examiner* — Victor Barzykin
(74) *Attorney, Agent, or Firm* — Posz Law Group, PLC

(57) ABSTRACT

In a method for manufacturing a silicon carbide semiconductor device having a JFET, a trench is formed in a semiconductor substrate, and a channel layer and a second gate region are formed on an inner wall of the trench. The channel layer and the second gate region are planarized to expose a source region. A first recess deeper than a thickness of the source region is formed on both leading ends of the trench, and an activation annealing process of 1300° C. or higher is conducted in an inert gas atmosphere. A first conductivity type layer formed by the annealing process to cover a corner which is a boundary between a bottom and a side of the first recess is removed.

5 Claims, 5 Drawing Sheets

(51) Int. Cl.
  *H01L 29/10*   (2006.01)
  *H01L 21/04*   (2006.01)
  *H01L 21/324*  (2006.01)
  *H01L 29/16*   (2006.01)
  *H01L 21/82*   (2006.01)
  *H01L 29/06*   (2006.01)

(52) U.S. Cl.
  CPC ......... *H01L21/324* (2013.01); *H01L 29/1058* (2013.01); *H01L 29/1066* (2013.01); *H01L 29/8083* (2013.01); *H01L 21/3247* (2013.01); *H01L 21/8213* (2013.01); *H01L 29/0619* (2013.01); *H01L 29/0661* (2013.01); *H01L 29/0696* (2013.01); *H01L 29/1608* (2013.01)

(56) References Cited

U.S. PATENT DOCUMENTS

| 2005/0029558 | A1 | 2/2005 | Hatakeyama et al. |
| 2005/0233539 | A1 | 10/2005 | Takeuchi et al. |
| 2006/0226504 | A1 | 10/2006 | Hatakeyama et al. |
| 2010/0025693 | A1* | 2/2010 | Malhan et al. ................. 257/76 |
| 2011/0156054 | A1* | 6/2011 | Takeuchi et al. ............... 257/77 |
| 2011/0198613 | A1 | 8/2011 | Shimizu et al. |
| 2014/0159058 | A1 | 6/2014 | Takeuchi |

OTHER PUBLICATIONS

Kim et al., "Trench corner rounding technology using hydrogen annealing for highly reliable trench DMOSFETS", ISPSO 2000, proceedings, May 2000, pp. 87-90.*

International Search Report and Written Opinion of the International Searching Authority mailed Jun. 25, 2013 for the corresponding International application No. PCT/JP2013/002434 (and English translation).

Extended European Search Report issued Oct. 20, 2015 in the corresponding EP application No. 13778761.0.

* cited by examiner

METHOD FOR MANUFACTURING SILICON CARBIDE SEMICONDUCTOR DEVICE

CROSS REFERENCE TO RELATED APPLICATION

The present disclosure is a U.S. national stage application of PCT/JP2013/002434 filed on Apr. 10, 2013 and is based on Japanese Patent Application No. 2012-94110 filed on Apr. 17, 2012, the disclosures of which are incorporated herein by reference.

TECHNICAL FIELD

The present disclosure relates to a method for manufacturing a silicon carbide semiconductor device (hereinafter referred to as "SiC") having a junction field effect transistor (JFET) of a trench structure.

BACKGROUND ART

The SiC semiconductor device having the JFET of the trench structure is disclosed in PTL 1. The JFET disclosed in PTL 1 is configured as follows. After an n$^-$ type drift layer, a p$^+$ type first gate region, and an n$^+$ source region are formed on an n$^+$ SiC substrate in the stated order, a trench is formed to penetrate those regions, and an n$^-$ type channel layer and a p$^+$ second gate region are formed within the trench. Then, a gate electrode is formed on a surface of the second gate region, and a source electrode is formed over the gate electrode through an interlayer insulating film, and a drain electrode is formed on a rear surface of the n$^+$ SiC substrate.

The JFET thus configured has a structure in which the trench is laid out in a strip shape. However, when the n$^-$ type channel layer epitaxially grows, both leading ends of the trench become thicker than sidewall surfaces configuring long sides of the trench, and a variation in threshold is caused. For that reason, in the JFET disclosed in PTL 1, a recess deeper than the n$^+$ source region is formed on each leading end of the trench to eliminate the n$^+$ type source region, so that no JFET is configured on both leading ends of the trench. As a result, the JFET is configured on only inner positions of the long sides of the trench so that the variation in threshold can be prevented, and an excess drain current can be prevented from being generated due to the variation in threshold when the gate voltage becomes closer to the threshold.

CITATION LIST

Patent Literature

[PTL 1] JP-A-2011-134970 (corresponding to US 2011/0156054 A1)

SUMMARY OF INVENTION

Technical Problem

When an outer peripheral high breakdown voltage structure is provided for the above conventional SiC semiconductor device, it is conceivable that a region in which the JFET is formed as a cell region, and a p type surface electric field relaxation (resurf) layer and a p type guard ring layer are formed to surround an outer periphery of the cell region. For example, a recess deeper than the p$^+$ type first gate region is formed into a mesa structure, and a p type resurf layer can be formed over sidewalls to a bottom surface of the recess configuring the mesa structure, that is a surface layer portion of the n$^-$ type drift layer exposed by the recess.

The p type resurf layer and the p type guard ring layer of this type are formed by conducting activation annealing after, for example, p type impurities are ion-implanted thereinto. However, it is confirmed that an n type layer is formed on each of corners of the recess formed on both leading ends of the trench, and the recess configuring the mesa structure, and the characteristic is deteriorated due to the n type layer. The above phenomenon will be described specifically with reference to an example of a process of manufacturing an SiC semiconductor device having the JFET.

As illustrated in FIG. 7A, after an n$^-$ type drift layer J2, a p$^+$ type first gate region J3, and an n$^+$ source region J4 are formed on an n$^+$ SiC substrate J1 by epitaxial growth in the stated order, a trench J5 is formed to penetrate those portions. Also, an n$^-$ type channel layer J6 and a p$^+$ second gate region J7 are formed within the trench J5. Then, the surface is planarized.

Subsequently, as illustrated in FIG. 7B, a recess J8 deeper than a thickness of the n$^+$ type source region J4 is formed on a leading end of the trench J5, and a recess J9 for configuring an outer peripheral high breakdown voltage portion is formed. Then, as illustrated in FIG. 7C, after a p type resurf layer J10 and a contact p type layer not shown are formed over sides to a bottom of the recess J9 by ion implantation of p type impurities, an activation annealing process of about 1600° C. is conducted thereon, for example, in an Ar atmosphere.

As a result of conducting the annealing process, as illustrated in FIG. 7D, it is confirmed that an n$^+$ type layer J11 is formed on a corner of the recess J8, and a high concentration junction between the n$^+$ type layer J11 and the p$^+$ type first gate region J3 or the second gate region J7 is configured. As a result, it is found that there arises such a problem that a drain potential is exposed on the first gate region J3, a breakdown voltage between a gate and a drain is reduced, and a high concentration junction leakage (gate leakage or drain leakage) is generated.

The activation annealing process is conducted under a slight SiC growth atmosphere for the purpose of preventing generation of step bunching. For that reason, in order to prevent SiC from growing on a substrate surface, the activation annealing process is conducted under a condition where a growth rate becomes low. However, because the growth rate is low, it is conceivable that a slight amount of nitrogen (N) is liable to be taken in grown SiC, and appears as the n$^+$ type layer J11.

Also, in conducting the activation annealing process, an n$^+$ type layer 12 is formed on a corner of the recess J9 for forming the p type resurf layer J10. Because a pn junction of the p type resurf layer J10 and the n$^+$ type layer J12 is formed by the n$^+$ type layer J12, there arises such a problem that a drain breakdown voltage is decreased.

In view of the above circumstances, a first object of the present disclosure is to suppress the generation of a high concentration junction leakage in a structure where a recess is so formed as not to form a JFET structure on a leading end of a trench in which a gate region is provided. Also, a second object of the present disclosure is to suppress a reduction of a drain breakdown voltage when the recess for forming the resurf layer is formed.

Solution to Problem

According to one aspect of the present disclosure, there is provided a method for manufacturing a silicon carbide semiconductor device having a JFET in which a semiconductor substrate is prepared which includes a first conductivity type substrate that is made of silicon carbide, a drift layer of a first conductivity type that is formed on the first conductivity type substrate by epitaxial growth, a first gate region of a second conductivity type that is formed on the drift layer by epitaxial growth, a source region of the first conductivity type that is formed on the first gate region by epitaxial growth or ion implantation. A strip shaped trench having a longitudinal direction in one direction which penetrates through the source region and the first gate region to reach the drift layer is formed. A channel layer of the first conductivity type is formed on an inner wall of the trench by epitaxial growth. A second gate region of the second conductivity type is formed on the channel layer. The channel layer and the second gate region are planarized to expose the source region. After planarizing, selective etching is conducted to remove at least the source region, the channel layer, and the second gate region on both leading ends of the trench, and a first recess deeper than a thickness of the source region is formed on both the leading ends of the trench. After the first recess is formed, an activation annealing process of 1300° C. or higher is conducted in an inert gas atmosphere. A first conductivity type layer formed by the annealing process to cover a corner which is a boundary between a bottom and a side of the first recess is removed.

In the above manufacturing method, the first conductivity type layer formed in the annealing process on the corner which is the boundary between the bottom and the side of the first recess is removed. For that reason, as in the case where the first conductivity type layer remains, the high concentration junction formed between the first conductivity type layer and the first gate region or the second gate region which are different in conductivity type are not formed. Therefore, a drain potential can be prevented from being exposed on the first gate region to reduce a breakdown voltage between a gate and a drain, and a high concentration junction leakage (gate leakage or drain leakage) can be prevented from being generated.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of the present disclosure will be described with reference to the drawings. In the following respective embodiments, parts identical with or equivalent to each other are denoted by the same symbols for description.

First Embodiment

An SiC semiconductor device having a JFET according to a first embodiment of the present disclosure will be described. The SiC semiconductor device having the JFET illustrated in FIGS. 1 to 4 is configured with the use of an $n^+$ type SiC substrate 1. The $n^+$ type SiC substrate 1 can be formed of, for example, an off substrate. However, a layout of cells of the JFET formed on the $n^+$ type SiC substrate 1 and an off direction are irrelevant to each other, and the layout of the cells of the JFET do not need to be adjusted in the off direction.

Figure 2:
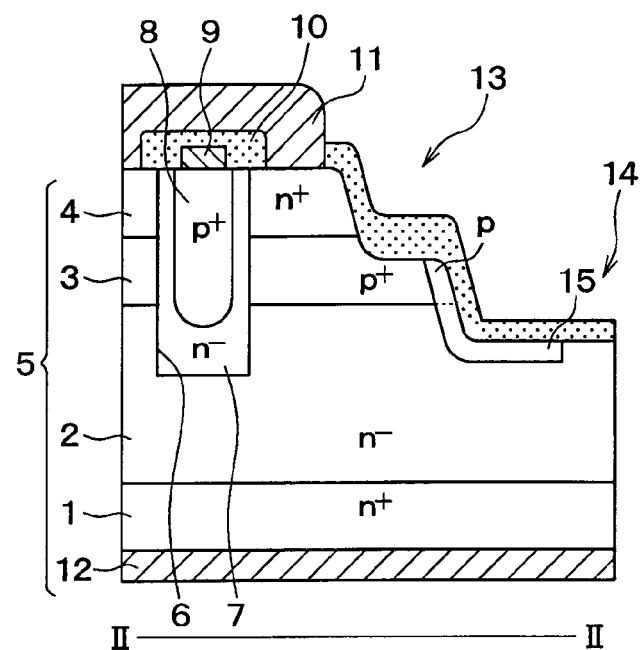
FIG. 2 is a cross-sectional view of the SiC semiconductor device taken along a line II-II in FIG. 1.

First, a basic structure of the JFET will be described with reference to FIG. 2. A trench 6 is formed on a semiconductor substrate 5 in which an $n^-$ type drift layer 2, a $p^+$ type first gate region 3, and an $n^+$ type source region 4 are formed on the $n^+$ type SiC substrate 1 in the stated order. An $n^-$ type channel layer 7 is formed on an inner wall of the trench 6 to a surface of the semiconductor substrate 5. A $p^+$ type second gate region 8 is formed on a surface of the $n^-$ type channel layer 7 so as to be completely embedded within the trench 6. A gate electrode 9 is formed on a surface of the second gate region 8, and a source electrode 11 is formed over the gate electrode 9 through an interlayer insulating film 10. The source electrode 11 is electrically connected to the $n^+$ type source region 4 through contact holes formed in the interlayer insulating film 10. A drain electrode 12 is formed on a rear surface of the $n^+$ type SiC substrate 1, and electrically connected to the $n^+$ type SiC substrate 1 which is a drain region.

Figure 1:
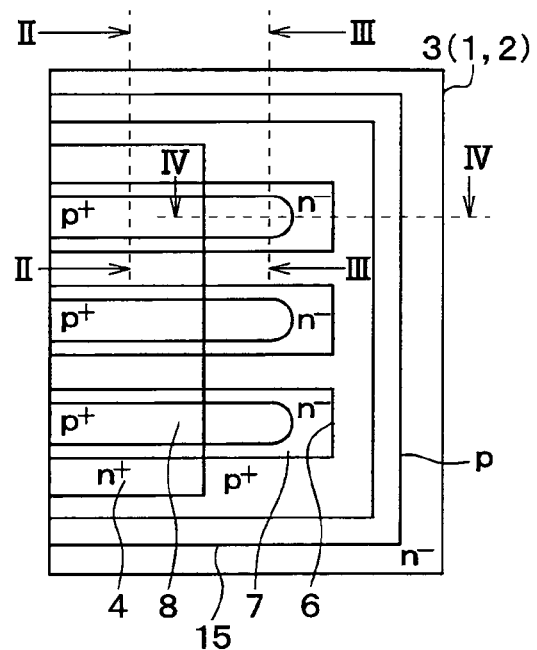
FIG. 1 is a plan view of a part of an SiC semiconductor device having a JFET according to a first embodiment of the present disclosure.
Figure 3:
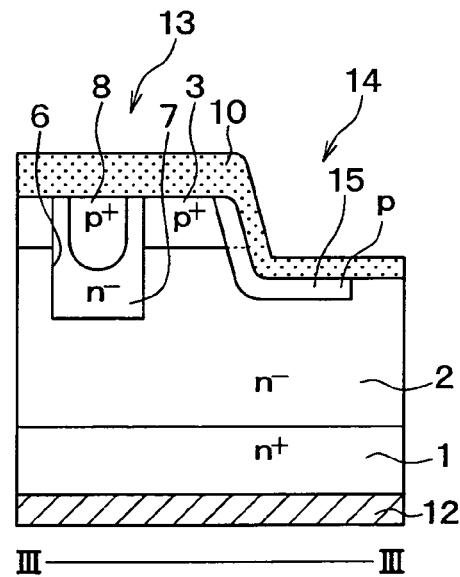
FIG. 3 is a cross-sectional view of the SiC semiconductor device taken along a line III-III in FIG. 1.
Figure 4:
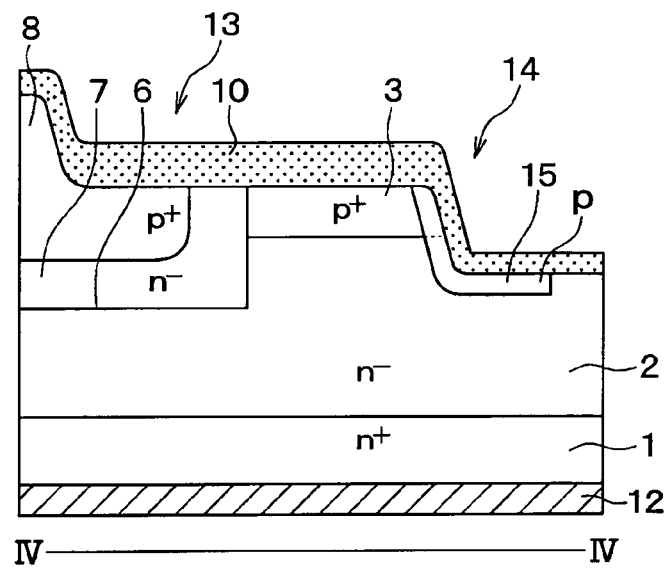
FIG. 4 is a cross-sectional view of the SiC semiconductor device taken along a line IV-IV in FIG. 1.

Also, as illustrated in FIG. 1, an opening shape of the trench 6 is formed into a strip shape, and plural trenches 6 each having the opening shape are arrayed in parallel to each other so as to be arranged in a strip shape. As illustrated in FIGS. 2 to 4, a recess (first recess) 13 is formed on an outer edge of the $n^+$ type SiC substrate 1 including a periphery of both leading ends of the trench 6 to provide a recess shape. With the above configuration, a mesa structure from which the n+ type source region 4 is removed is provided, and the n− type channel layer 7 and the second gate region 8 are removed on both the leading ends of the trench 6. For that reason, the n+ type source region 4 remains at only positions adjacent to long sides of the respective trenches 6, and a JFET structure is configured in only that region.

In the SiC semiconductor device having the JFET thus configured, even if the n− type channel layer 7 formed on both the leading ends of the trenches 6 is thicker than a portion located at the long sides of the trenches 6, the JFET structure is not configured on both the leading ends of the trenches 6. For that season, unlike the structure in which the JFET structure is configured on both the leading ends of the trench 6, a threshold of the JFET structure on both the leading ends does not deviate from a threshold of the JFET structure of the portion located on the long sides of the trench 6, and there is no influence of the deviation. Therefore, the SiC semiconductor device having a structure that can suppress an excess drain current that is generated when the gate voltage comes closer to the threshold can be provided.

In particular, it is preferable that the recess 13 is shaped so that a region of the n− type channel layer 7 which is thicker than a portion formed on a long side portion of the trench 6 is provided, and a region longer than the thickness of the first gate region 3 is removed from that region, on both the leading ends of the trench 6. With the above configuration, a distance between a channel portion having an increased thickness and the n+ type source region 4 becomes equal to or longer than a channel length, and even at the time of an off state close to the threshold voltage, the drain current is completely cut off, and the excess drain current can be prevented from being generated.

Further, in the SiC semiconductor device according to the present embodiment, a recess (second recess) 14 deeper than the first gate region 3, and reaching the n− drift layer 2 is formed in an outer peripheral region that surrounds a cell region in which a cell of the JFET is formed, to provide a mesa structure. The recess 14 is formed to surround the cell region, and a p type resurf layer 15 is formed on the side to the bottom of the recess 14. With the p type resurf layer 15, an equipotential line can extensively extend in an outer periphery of the cell region without deviation, and an electric field concentration can be reduced. As a result, a breakdown voltage can be improved. Although not shown, a p type guard ring layer can be further formed in an outer periphery of the p type resurf layer 15. An outer peripheral high breakdown voltage structure can be configured by the p type resurf layer 15 and the p type guard ring layer, and the breakdown voltage of the SiC semiconductor device can be improved.

In the SiC semiconductor device according to the present embodiment configured as described above, no n type layer is formed on corners of the recess 13 and the recess 14. For that reason, the high concentration junction leakage can be prevented from being generated unlike a case in which the n type layer is formed on the corner of the recess 13. Also, the drain breakdown voltage can be prevented from decreasing unlike the case in which the n type layer is formed on the corner of the recess 14.

Figure 5A:
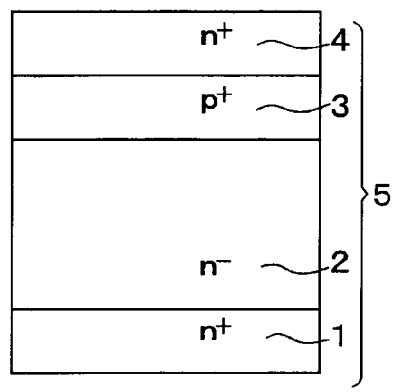
FIG. 5A is a cross-sectional view illustrating a process of manufacturing the SiC semiconductor device.

Subsequently, a method for manufacturing the SiC semiconductor device according to the present embodiment will be described with reference to FIGS. 5A to 5F, and FIGS. 6A to 6E. FIGS. 5A, 5C, and 5E illustrate states of a manufacturing process of a cross-section corresponding to FIG. 2, and FIGS. 5B, 5D, and 5F illustrate states of a manufacturing process of a cross-section corresponding to FIG. 4. Also, FIGS. 6A to 6E illustrate a manufacturing process of the SiC semiconductor device subsequent to FIGS. 5E and 5F.

Figure 5B:
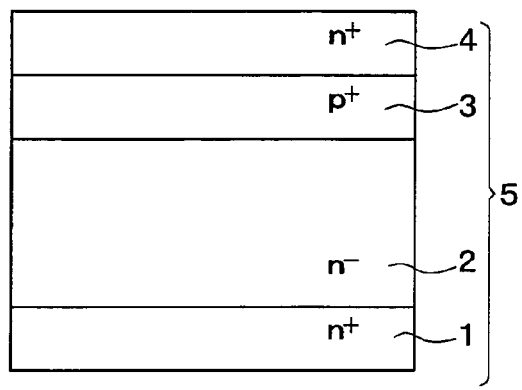
FIG. 5B is a cross-sectional view illustrating a process of manufacturing the SiC semiconductor device.
Figure 5C:
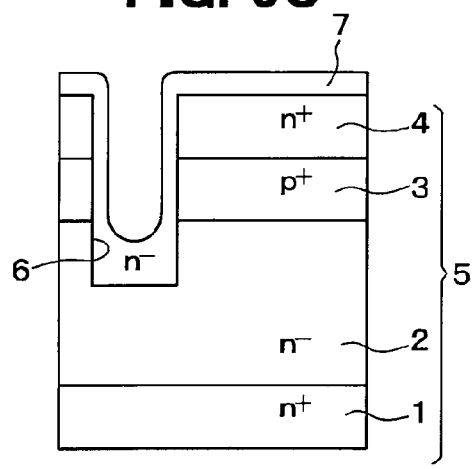
FIG. 5C is a cross-sectional view illustrating a process of manufacturing the SiC semiconductor device.

First, in the process illustrated in FIGS. 5A and 5B, the n− drift layer 2, the p+ type first gate region 3, and the n+ type source region 4 epitaxially grow on the surface of the n+ type SiC substrate 1 in the stated order, to thereby configure the semiconductor substrate 5.

Figure 5D:
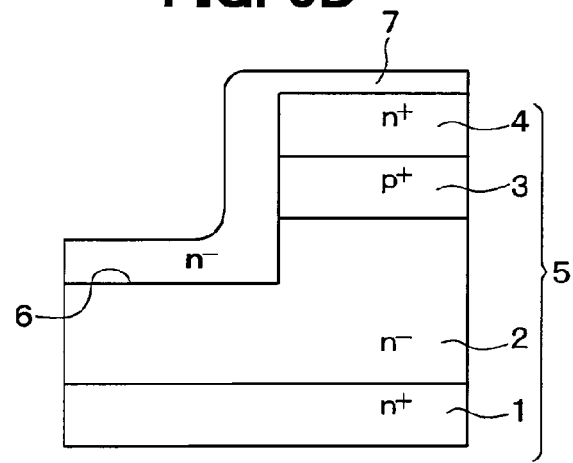
FIG. 5D is a cross-sectional view illustrating a process of manufacturing the SiC semiconductor device.
Figure 5E:
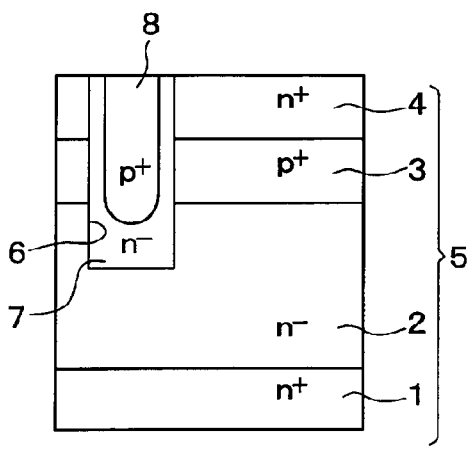
FIG. 5E is a cross-sectional view illustrating a process of manufacturing the SiC semiconductor device.

Subsequently, in the process illustrated in FIGS. 5C and 5D, a mask not shown in which an region to be formed with the trench 6 is opened is arranged. Thereafter, anisotropic etching such as reactive ion etching (RIE) is conducted to form the trench 6. Then, the n− type channel layer 7 is formed by epitaxial growth. In this situation, with the migration of the n− type channel layer 7, a thickness of the n− type channel layer 7 is thicker than that a sidewall surface of the long side of the trench 6 on the bottom and both the leading ends of the trench 6.

Figure 5F:
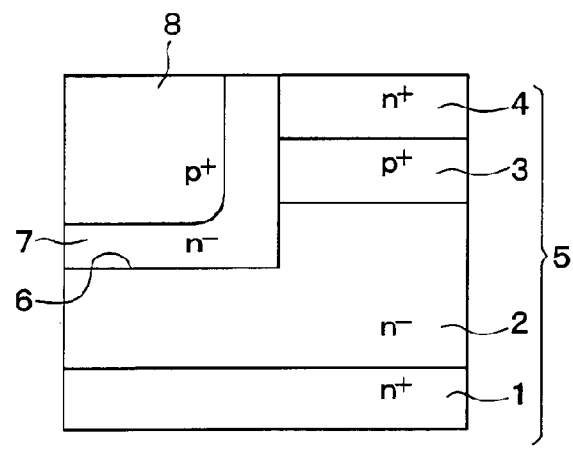
FIG. 5F is a cross-sectional view illustrating a process of manufacturing the SiC semiconductor device.
Figure 6A:
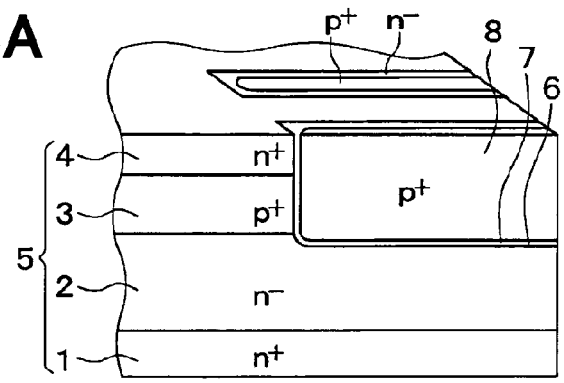
FIG. 6A is a perspective cross-sectional view illustrating a process of manufacturing the SiC semiconductor device.

Also, in the process illustrated in FIGS. 5E and 5F, the second gate region 8 of the p+ type layer epitaxially grows on the surface of the n− type channel layer 7. Thereafter, the second gate region 8 and the n− type channel layer 7 are planarized by grinding or chemical-mechanical polishing (CMP) to expose the n+ type source region 4. The second gate region 8 and the n− type channel layer 7 remain only in the interior of the trench 6. With the above process, a perspective cross-sectional structure illustrated in FIG. 6A is configured.

Figure 6B:
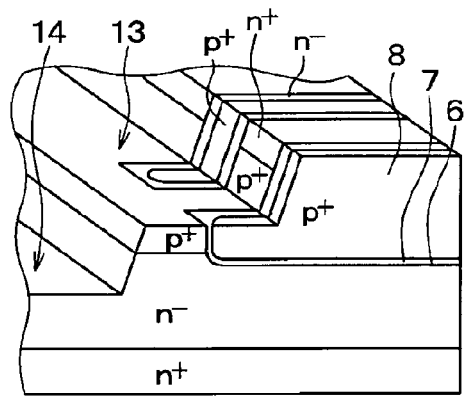
FIG. 6B is a perspective cross-sectional view illustrating a process of manufacturing the SiC semiconductor device.

Subsequently, in the process illustrated in FIG. 6B, the outer edge of the cell region is selectively etched to configure the mesa structure. Two-step etching is conducted to form the recesses 13 and 14, sequentially.

First, the outer edge of the cell region is selectively etched to a position deeper than the n+ type source region 4 by anisotropic etching such as RIE to remove the n+ type source region 4. At the same time, n+ type source region 4, the n− type channel layer 7, and the second gate region 8 are partially removed in the vicinity of both the leading ends of the trench 6 to form the recess 13. Specifically, after the mask in which the region to be formed with the recess 13 (the outer edge of the cell region, and portions of the n+ type source region 4, the n− type channel layer 7, and the second gate region 8 which are partially removed) is opened is arranged, the anisotropic etching is conducted to form the recess 13.

Subsequently, with a mask different from the mask used before, the interior of the recess 13 on the outer edge of the cell region is selectively etched to a position deeper than the p+ first gate region 3 to remove the first gate region 3, thereby forming the recess 14. Specifically, after the mask in which the region to be formed with the recess 14 (an outer peripheral side from a portion of the outer edge of the cell region in which the p type resurf layer 15 is arranged) is opened is arranged, the anisotropic etching is conducted to form the recess 14.

Figure 6C:
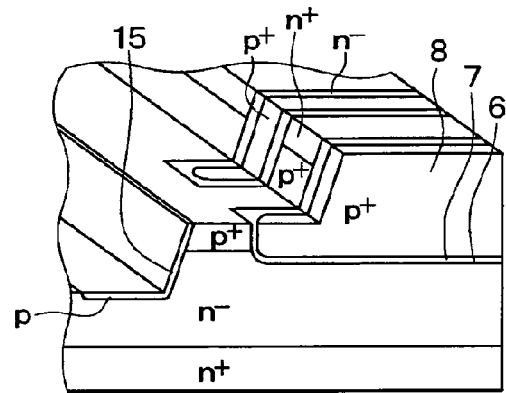
FIG. 6C is a perspective cross-sectional view illustrating a process of manufacturing the SiC semiconductor device.
Figure 6D:
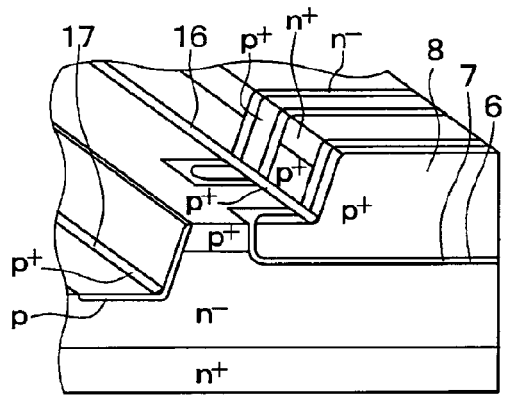
FIG. 6D is a perspective cross-sectional view illustrating a process of manufacturing the SiC semiconductor device.
Figure 6E:
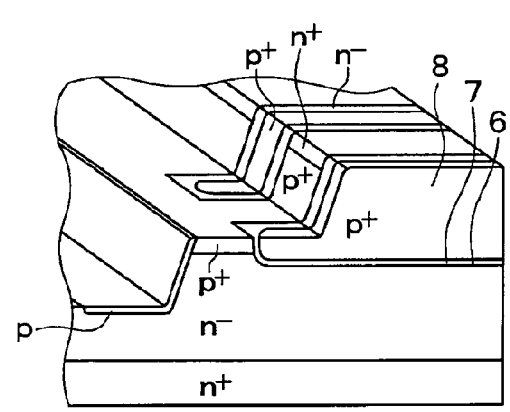
FIG. 6E is a perspective cross-sectional view illustrating a process of manufacturing the SiC semiconductor device.
Figure 7A:
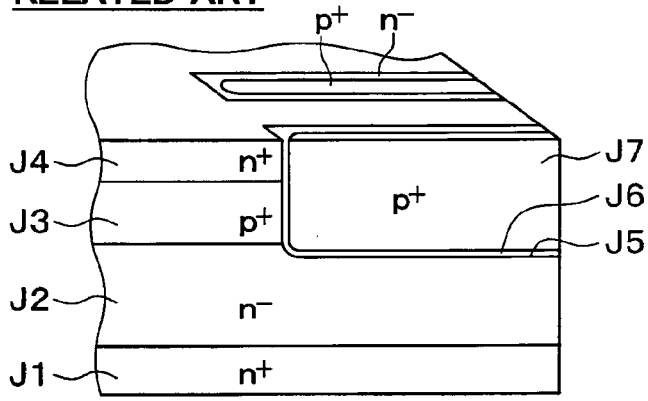
FIG. 7A is a perspective cross-sectional view illustrating a process of manufacturing the SiC semiconductor device having a JFET according to a related art.
Figure 7B:
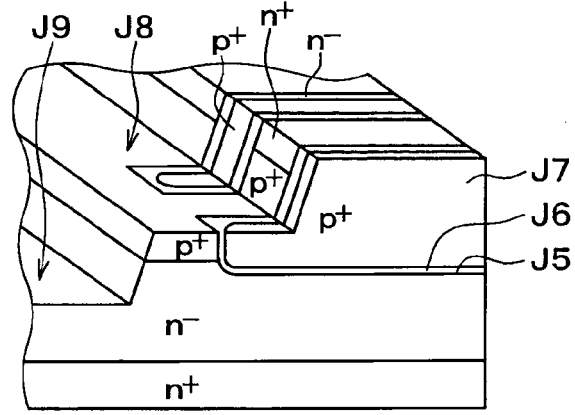
FIG. 7B is a perspective cross-sectional view illustrating a process of manufacturing the SiC semiconductor device having the JFET according to the related art.
Figure 7C:
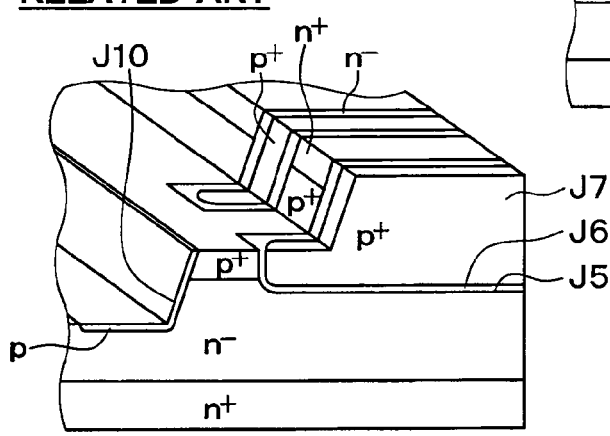
FIG. 7C is a perspective cross-sectional view illustrating a process of manufacturing the SiC semiconductor device having the JFET according to the related art.
Figure 7D:
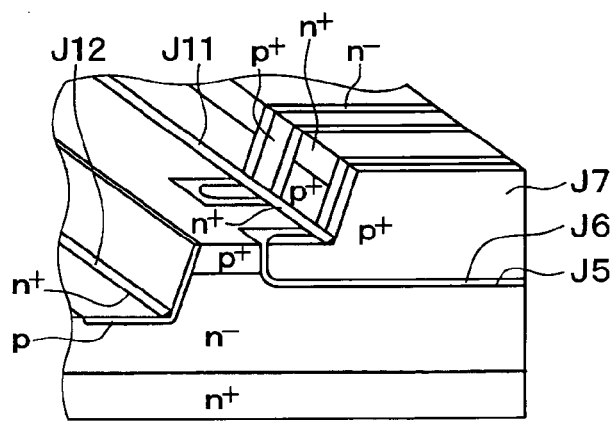
FIG. 7D is a perspective cross-sectional view illustrating a process of manufacturing the SiC semiconductor device having the JFET according to the related art.

Then, after the mask used at the time of etching is removed, the mask in which regions to be formed with the p type resurf layer 15 and the p type guard ring layer not shown are opened is arranged, and p type impurities are ion-implanted, to thereby form the p type resurf layer 15 as illustrated in FIG. 6C. Thereafter, an activation annealing process is conducted at 1300° C. or higher, for example, 1600° C. in an inert gas atmosphere such as Ar. As a result, the impurities doped in the various impurity layers such as the p type resurf layer 15 are activated, and the corners of the recesses 13 and 14 are rounded to the degree that the radius of curvature becomes 100 nm or higher.

At the same time, an n type layer 16 is formed on the corner which is a boundary between the bottom and the side of the recess 13, and an n type layer 17 is formed on the corner which is a boundary between the bottom and the side of the recess 14. Those n type layers 16 and 17 are formed due to a slight amount of nitrogen that is naturally present in an inert gas atmosphere, and the n type impurity concentration is about $1 \times 10^{17}$ to $1 \times 18^{18}$ cm$^{-3}$.

Thereafter, an overall surface of the substrate is etched. For example, surface etching is conducted by anisotropic etching such as RIE, and kept to the amount of etching as much as the first gate region 3 is not completely removed (that is, a part of the first gate region 3 remains) in the bottom of the recess 13 while being etched to a depth equal to or more than the thickness of the n type layers 16 and 17. With the above processing, the n type layers 16 and 17 formed on the corners of the recess 13 and the recess 14 are removed.

Although the subsequent processes are not shown, the same manufacturing process as the conventional one such as a process of forming the gate electrode 9, a process of forming the interlayer insulating film 10, a process of forming the contact holes, a process of forming the source electrode 11, and a process of forming the drain electrode 12 is conducted to complete the SiC semiconductor device illustrated in FIG. 1. The process of forming the interlayer insulating film 10 is conducted after the n type layers 16 and 17 are removed. Since the corners of the recesses 13 and 14 are rounded by the activation annealing process, crack can be prevented from being generated in the interlayer insulating film 10 formed on the recesses 13 and 14, and a gate-source leakage caused by the crack can be prevented.

As described above, in the present embodiment, the recess 13 is formed so that the JFET structure is not formed on both the leading ends of the trench 6 provided in the second gate region 8. In the above structure, the n type layer 16 formed on the corner which is the boundary between the bottom and the side of the first recess 13 in the annealing process is removed. For that reason, as in the case where the n type layer 16 remains, the high concentration junction formed between the n type layer 16 and the p$^+$ type first gate region 3 or the second gate region 8, which are different in conductivity type can be eliminated. Therefore, the drain potential can be prevented from being exposed on the first gate region 3 to reduce the breakdown voltage between the gate-drain breakdown voltage, and the high concentration junction leakage (gate leakage or drain leakage) can be prevented from being generated.

For reference purposes, as a result of investigating the gate-drain breakdown voltage, the gate-drain breakdown voltage is about 50V in a state where the n type layer 16 is formed as in the conventional art. On the other hand, it is confirmed that the gate-drain breakdown voltage is improved to 1100V or higher in the structure of the present embodiment. From this viewpoint, it is found that the gate-drain breakdown voltage can be prevented from being reduced with the removal of the n type layer 16.

Also, the n type layer 17 formed on the corner of the recess 14 in the annealing process is also removed. For that reason, the pn junction formed between the n type layer 16 and the p type resurf layer 15 which are different in conductivity type can be eliminated. For that reason, the drain breakdown voltage can be prevented from decreasing.

Other Embodiments

In the above respective embodiments, the JFET of the n-channel type in which the channel region is set in the n$^-$-type channel layer 7 has been exemplified. Alternatively, the present disclosure can be applied to the JFET of a p-channel type in which the conductivity types of the respective components are reversed.

Further, in the above embodiments, the epitaxially grown n$^+$ type source region 4 has been described. Alternatively, the n$^+$ type source region 4 may be formed by ion implantation of n type impurities into the first gate region 3. Also, in this case, when the ion implantation is conducted so that the n$^+$ type source region 4 are formed over both the leading ends of the trench 6, the same advantages as those in the above embodiments can be obtained with the formation of the recess 13.

Also, in the above embodiments, a description has been given of a case in which the present disclosure is applied to the SiC semiconductor device having the structure in which not only the recess 13 but also the recess 14 are formed. The present disclosure can be applied to a structure having at least one of the recess 13 and the recess 14.

In the above respective embodiments, a rectangle is exemplified as the strip-shaped trench 6 having the longitudinal direction as one direction. However, the trench 6 is not always rectangular, but may be a stripe shape such as parallelogram or a hexagonal shape in which a center portion between both leading ends is sharpened (for example, a shape making only two opposing sides of a regular hexagon longer).

The invention claimed is:

1. A method for manufacturing a silicon carbide semiconductor device having a JFET, comprising:
    preparing a semiconductor substrate including a first conductivity type substrate that is made of silicon carbide, a drift layer of a first conductivity type that is formed on the first conductivity type substrate by epitaxial growth, a first gate region of a second conductivity type that is formed on the drift layer by epitaxial growth, a source region of the first conductivity type that is formed on the first gate region by epitaxial growth or ion implantation;
    forming a strip shaped trench having a longitudinal direction in one direction and penetrating through the source region and the first gate region to reach the drift layer;
    forming a channel layer of the first conductivity type on an inner wall of the trench by epitaxial growth;
    forming a second gate region of the second conductivity type on the channel layer;
    planarizing the channel layer and the second gate region to expose the source region;
    after the planarizing, conducting selective etching to remove at least the source region, the channel layer, and the second gate region on both leading ends of the trench, and forming a first recess deeper than a thickness of the source region on both the leading ends of the trench;
    after the forming the first recess, conducting an activation annealing process at a temperature of 1300° C. or higher in an inert gas atmosphere;
    removing a first conductivity type layer formed by the annealing process, the first conductivity type layer covering only a corner which is a boundary between a bottom and a side of the first recess; and
    wherein the first conductivity type layer is formed by silicon carbide growth due to nitrogen in the inert gas atmosphere.

2. The method for manufacturing the silicon carbide semiconductor device having the JFET according to claim 1, wherein
the removing of the first conductivity type layer includes etching a surface of the first conductivity type layer so that the first gate area is not completely removed at the bottom of the first recess while etching an overall surface of the semiconductor substrate including an interior of the first recess to a depth equal to or more than the thickness of the first conductivity type layer.

3. The method for manufacturing the silicon carbide semiconductor device having the JFET according to claim 1, further comprising
forming an interlayer insulating film at a region including an interior of the first recess after the removing the first conductivity type layer.

4. The method for manufacturing the silicon carbide semiconductor device having the JFET according to claim 1, further comprising:
forming a second recess deeper than the first gate region and reaching the drift layer in an outer peripheral region surrounding a cell region in which a cell of the JFFT is formed; and
forming a resurf layer of a second conductivity type within the drift layer so as to be disposed on a bottom of the second recess and a side of the second recess,
wherein after the forming the resurf layer, the activation annealing process is conducted, and when the first conductivity type layer is removed after the activation annealing process, another first conductivity type layer formed by the activation annealing process to cover a corner which is a boundary between the bottom and the side of the second recess is also removed.

5. The method for manufacturing the silicon carbide semiconductor device having the JFET according to claim 4, wherein the second recess is formed adjacent to the first recess.

\* \* \* \* \*